(12) United States Patent
Slupsky

(10) Patent No.: US 7,109,730 B2
(45) Date of Patent: *Sep. 19, 2006

(54) NON-CONTACT TESTER FOR ELECTRONIC CIRCUITS

(75) Inventor: Steven Harold Slupsky, Edmonton (CA)

(73) Assignee: Scanimetrics Inc., Edmonton (CA)

( * ) Notice: Subject to any disclaimer, the term of this patent is extended or adjusted under 35 U.S.C. 154(b) by 0 days.

This patent is subject to a terminal disclaimer.

(21) Appl. No.: 11/113,806

(22) Filed: Apr. 25, 2005

(65) Prior Publication Data

US 2006/0066326 A1    Mar. 30, 2006

Related U.S. Application Data

(63) Continuation-in-part of application No. 10/666,553, filed on Sep. 19, 2003, now Pat. No. 6,885,202.

(30) Foreign Application Priority Data

Sep. 19, 2002    (CA) .................................... 2404183

(51) Int. Cl.
*G01R 31/308*    (2006.01)
(52) U.S. Cl. .................... 324/753; 324/765; 324/158.1
(58) Field of Classification Search .................... None
See application file for complete search history.

(56) References Cited

U.S. PATENT DOCUMENTS

| | | |
|---|---|---|
| 5,764,655 A | 6/1998 | Kirihata et al. |
| 6,161,205 A | 12/2000 | Tuttle |
| 6,331,782 B1 | 12/2001 | White et al. |
| 6,412,086 B1 | 6/2002 | Friedman et al. |
| 6,449,308 B1 | 9/2002 | Knight, Jr. et al. |
| 6,525,566 B1 | 2/2003 | Haigh et al. |
| 6,573,801 B1 | 6/2003 | Benham et al. |
| 6,625,682 B1 | 9/2003 | Simon et al. |
| 2002/0186106 A1 | 12/2002 | Miller |
| 2002/0196029 A1* | 12/2002 | Schmidt ..................... 324/500 |
| 2003/0042602 A1 | 3/2003 | Drost |
| 2003/0146771 A1 | 8/2003 | Moore |
| 2004/0004216 A1 | 1/2004 | Eldridge et al. |

* cited by examiner

*Primary Examiner*—Jermele Hollington
*Assistant Examiner*—Jimmy Nguyen
(74) *Attorney, Agent, or Firm*—Davis & Bujold, P.L.L.C.

(57) ABSTRACT

A non-contact tester for electronic circuits consists of an electronic circuit and independent scanning head, in combination. The electronic circuit includes a micro-fabricated wireless i/o cell and means for sending and receiving signals via the wireless i/o cell. The independent scanning head has a wireless i/o cell that is compatible with the wireless i/o cell on the electronic circuit. This enables data to be exchanged with the electronic circuit to confirm proper functioning of the electronic circuit.

6 Claims, 18 Drawing Sheets

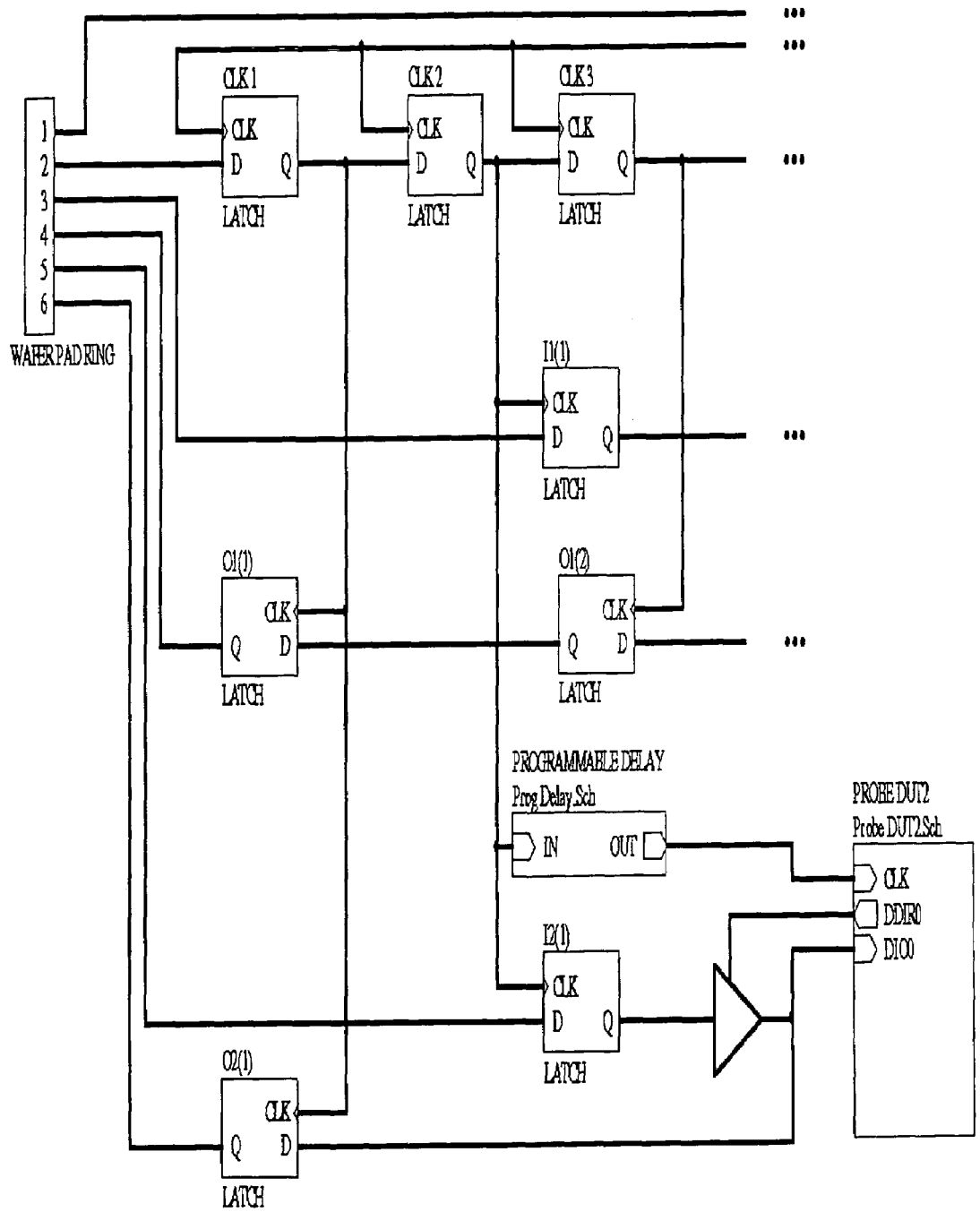
FIG. 7a1

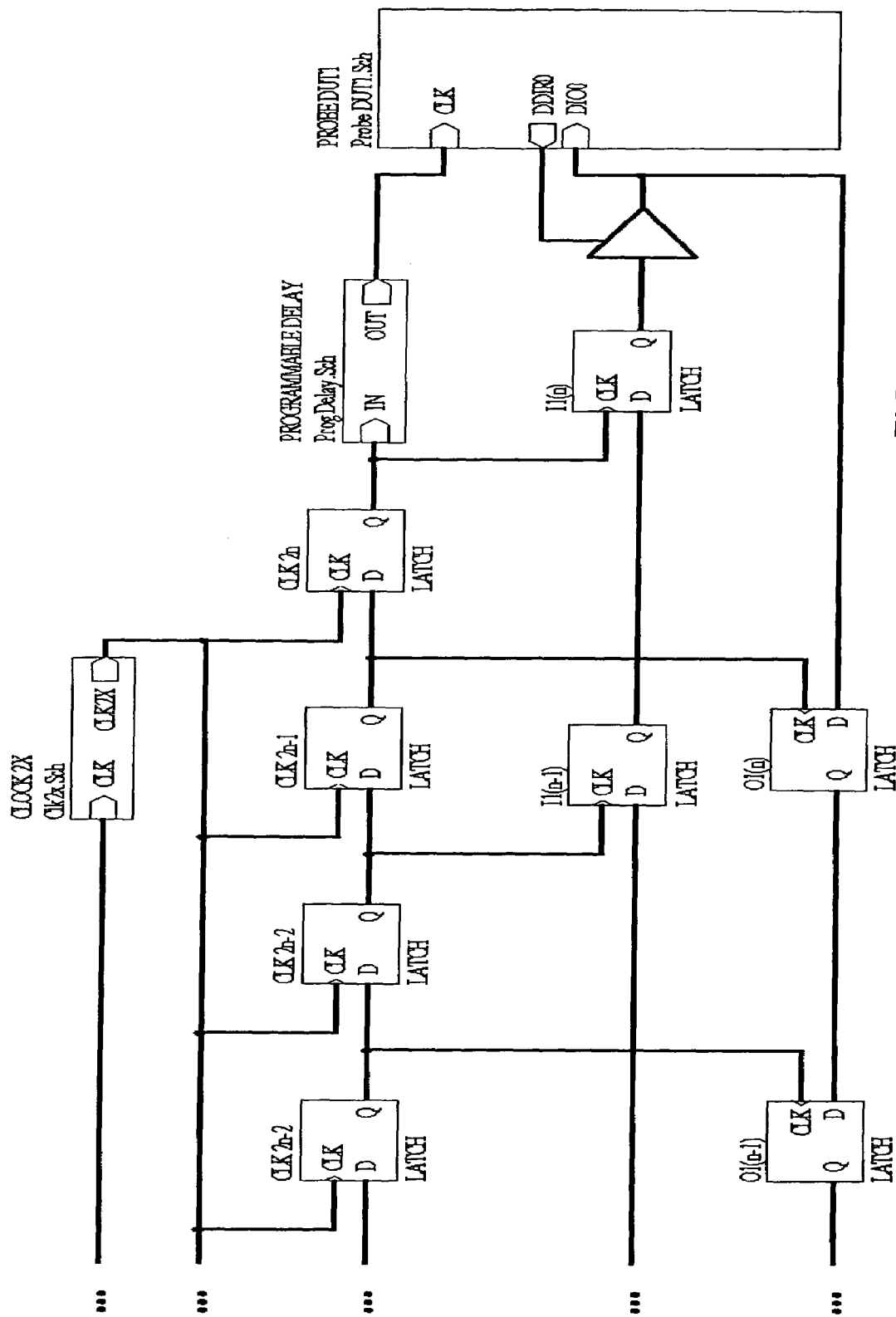
FIG. 7a2

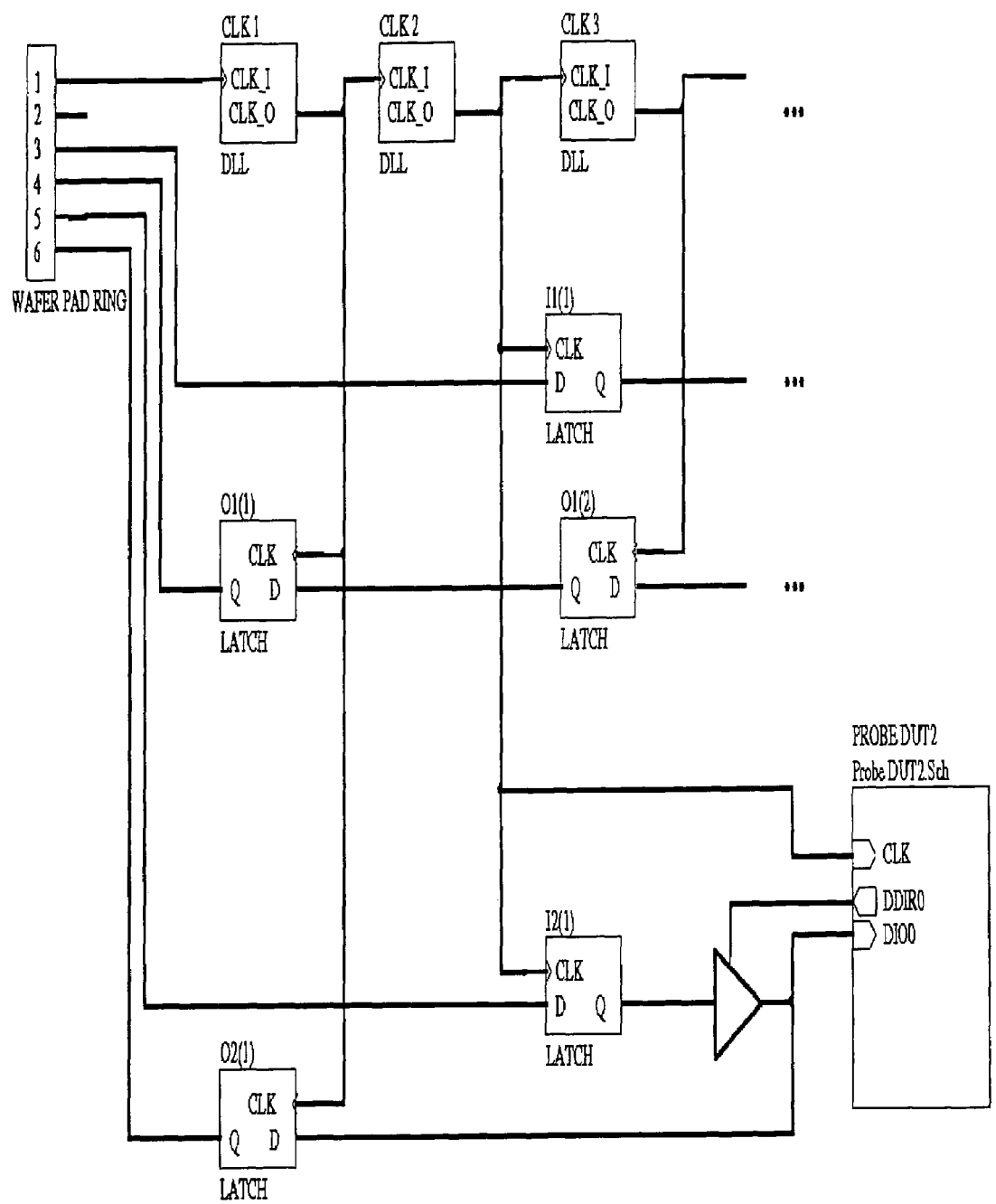
FIG. 7b1

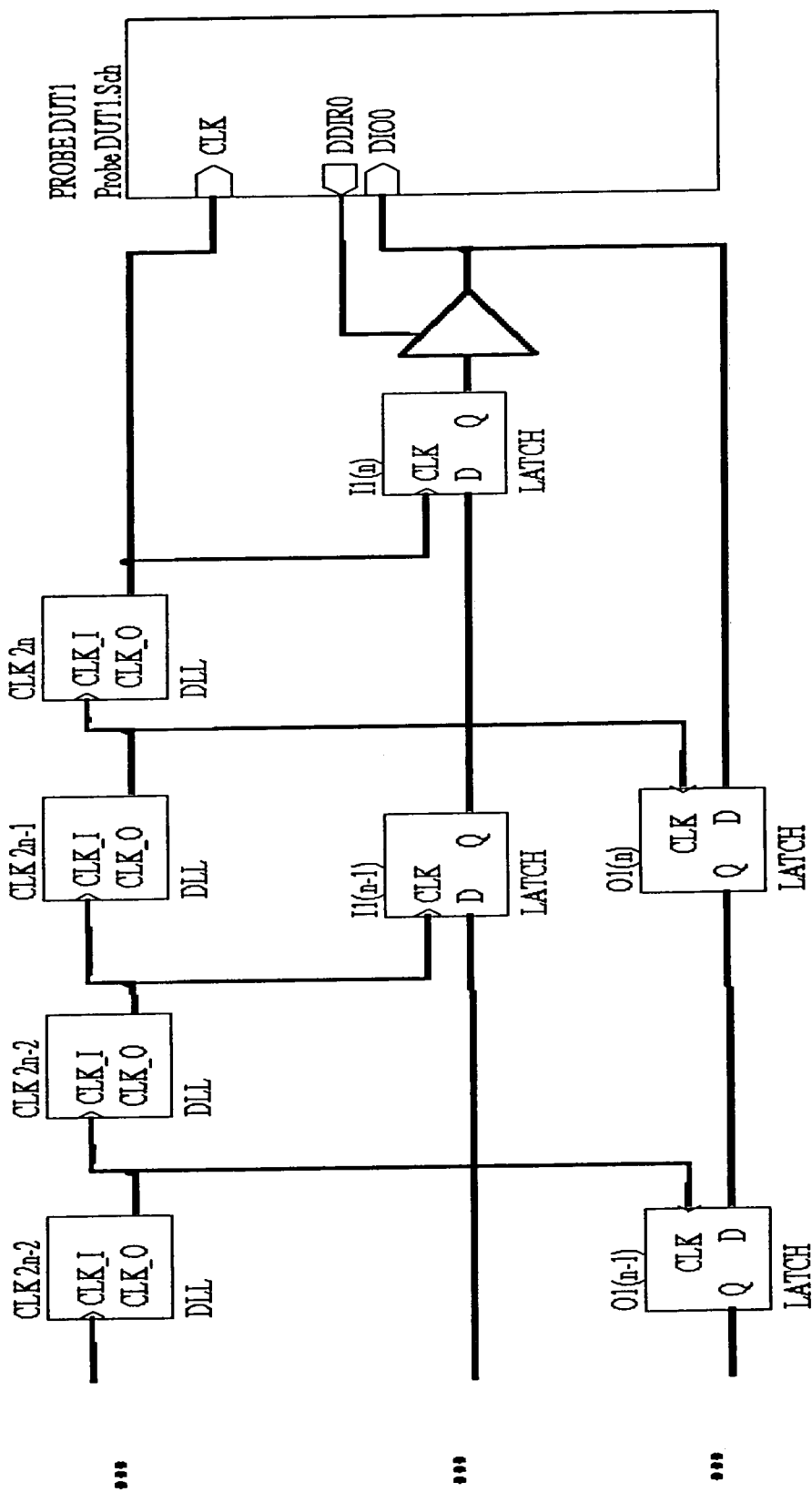
FIG. 7b2

Fig. 12 I/O Cell: Transceiver Block-diagram

Fig. 13 I/O Cell: Transmitter Block-diagram

Note:
   BPF--Bandpass filter
   VCO--Voltage-controlled oscillator
   ANT--Antenna
   SW--Switch Fig. 14 I/O Cell: Receiver Block-diagram Note:
  NBF--Narrow-band filter
  BPF--Bandpass filter
  AMP--Amplifier
  LNA--Low-noise amplifier
  ANT--Antenna
  SW--Switch

NON-CONTACT TESTER FOR ELECTRONIC CIRCUITS

This application is a continuation-in-part of U.S. Ser. No. 10/666,553 filed Sep. 19, 2003 now U.S. Pat. No 6,885,202 which claims priority from Canadian Application Serial No. 2,404,183 filed Sep. 19, 2002.

FIELD OF THE INVENTION

The present invention relates to testers for electronic circuits

BACKGROUND OF THE INVENTION

Electronic circuits must be tested to ensure that they are not defective. At the present time this is done through the use of mechanical probes. The mechanical probes touch down on the electronic circuit and data is passed through the circuit. However, in making contact with the electronic circuit, damage sometimes occurs when the mechanical probes make physical contact.

SUMMARY OF THE INVENTION

What is required is a tester for electronic circuits which is able to test the electronic circuits without making physical contact.

According to the present invention there is provided a non-contact tester for electronic circuits which consists of an electronic circuit and independent scanning head, in combination. The electronic circuit includes a micro-fabricated semiconductor chip which includes a plurality of wireless i/o cells and means for sending and receiving signals via the wireless contact. The independent scanning head has a wireless i/o cell frame compatible with the wireless i/o cell frame on the electronic circuit. This enables data to be exchanged with the electronic circuit to confirm proper functioning of the electronic circuit.

BRIEF DESCRIPTION OF THE DRAWINGS

These and other features of the invention will become more apparent from the following description in which reference is made to the appended drawings. The drawings are for the purpose of illustration only and are not intended to in any way limit the scope of the invention to the particular embodiment or embodiments shown, wherein:

FIGS. 7*a*1 and 7*a*2 (hereinafter referred to as FIG. 7*a*) is a schematic diagram demonstrating maintaining signal integrity using double the clock frequency.

FIGS. 7*b*1 and 7*b*2 (hereinafter referred to as FIG. 7*b*) is a schematic diagram demonstrating maintaining signal integrity using delay locked loops

DETAILED DESCRIPTION OF THE PREFERRED EMBODIMENT

The preferred embodiment, a non-contact tester for electronic circuits will now be described with reference to FIGS. 1 through 5.

Figure 1:
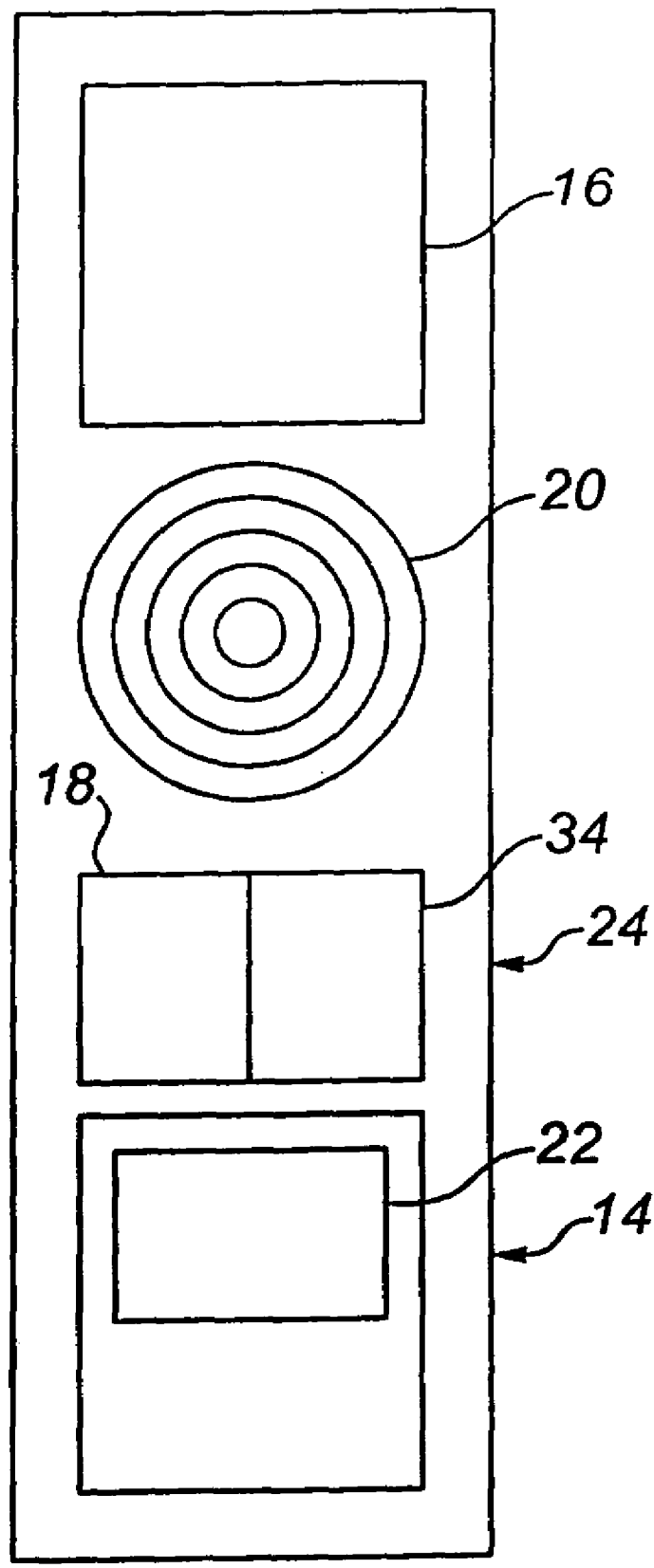
FIG. 1 is a top plan view of an i/o cell.
Figure 2:
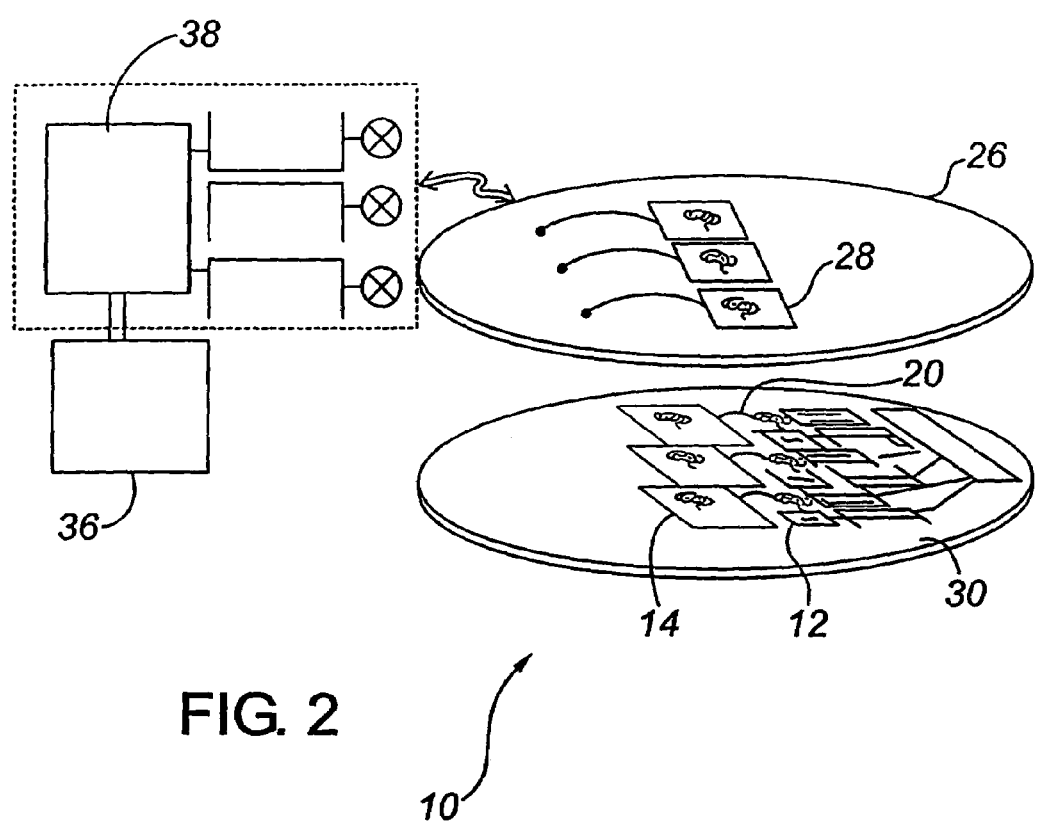
FIG. 2 is a representation of an independent scanning head scanning a series of electronic circuits in accordance with the teachings of the present invention.

Referring to FIG. 2, there is provided a non-contact tester for electronic circuits, generally referenced by numeral 10. Non-contact tester 10 includes an electronic circuit 12 illustrated in FIG. 3 which has a wireless i/o cell 14. Referring to FIG. 1, in the illustrated embodiment, i/o cell 14 includes a bond pad 16, a transmitter 18, a receiver 34, an antenna 20 and input/output elements 22, however, it will be appreciated that i/o cell 14 could work without a bond pad 16, or that antenna 20 could also function as a bond pad. Referring to FIG. 2, electronic circuit 12 also has a radio frequency interface generally referenced by numeral 24 for sending and receiving signals via wireless i/o cell 14 illustrated in FIG. 1.

Figure 4:
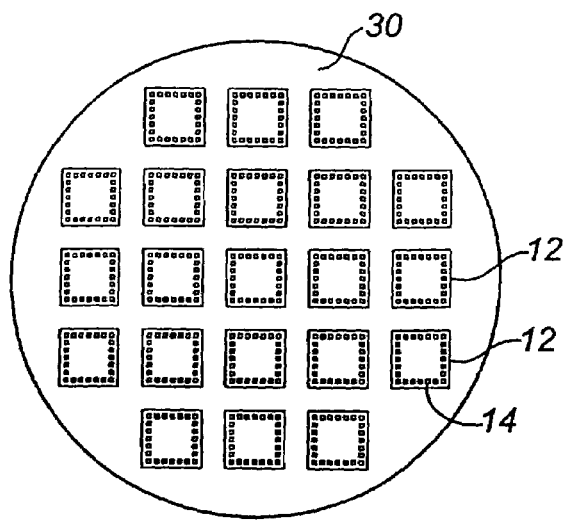
FIG. 4 is an top plan view of a wafer having with a plurality of electronic circuits.
Figure 5:
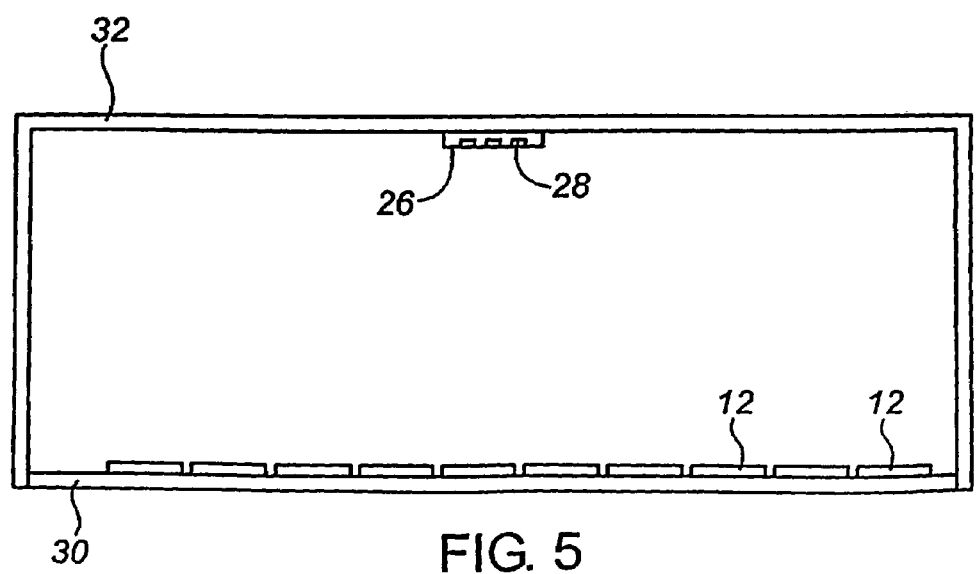
FIG. 5 is a side elevation view of the non-contact tester constructed in accordance with the teachings of the invention.
Figure 6A:
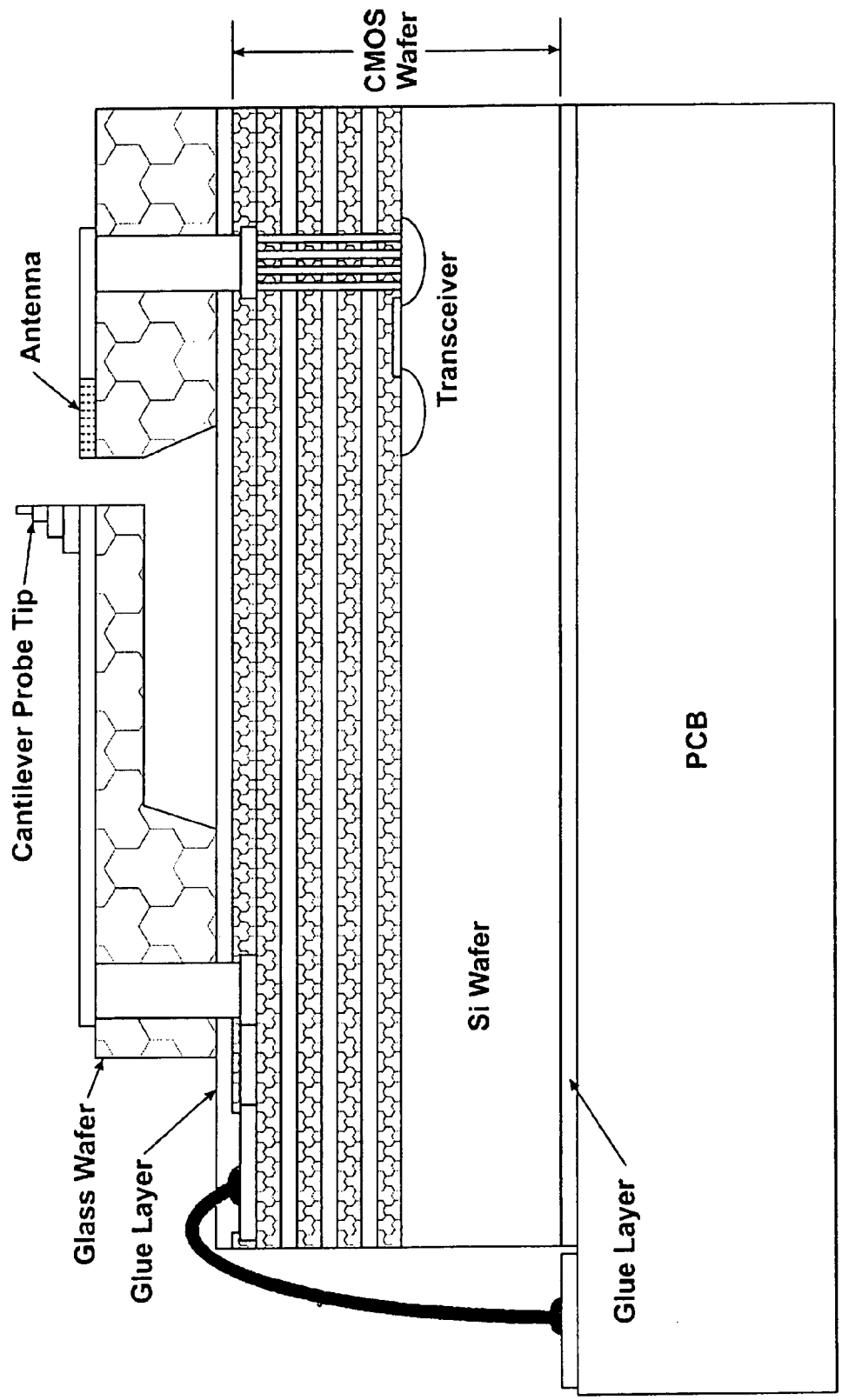
FIG. 6*a* is a side elevation view, in section, of a standard cantilever probe for a hybrid probe card.
Figure 6B:
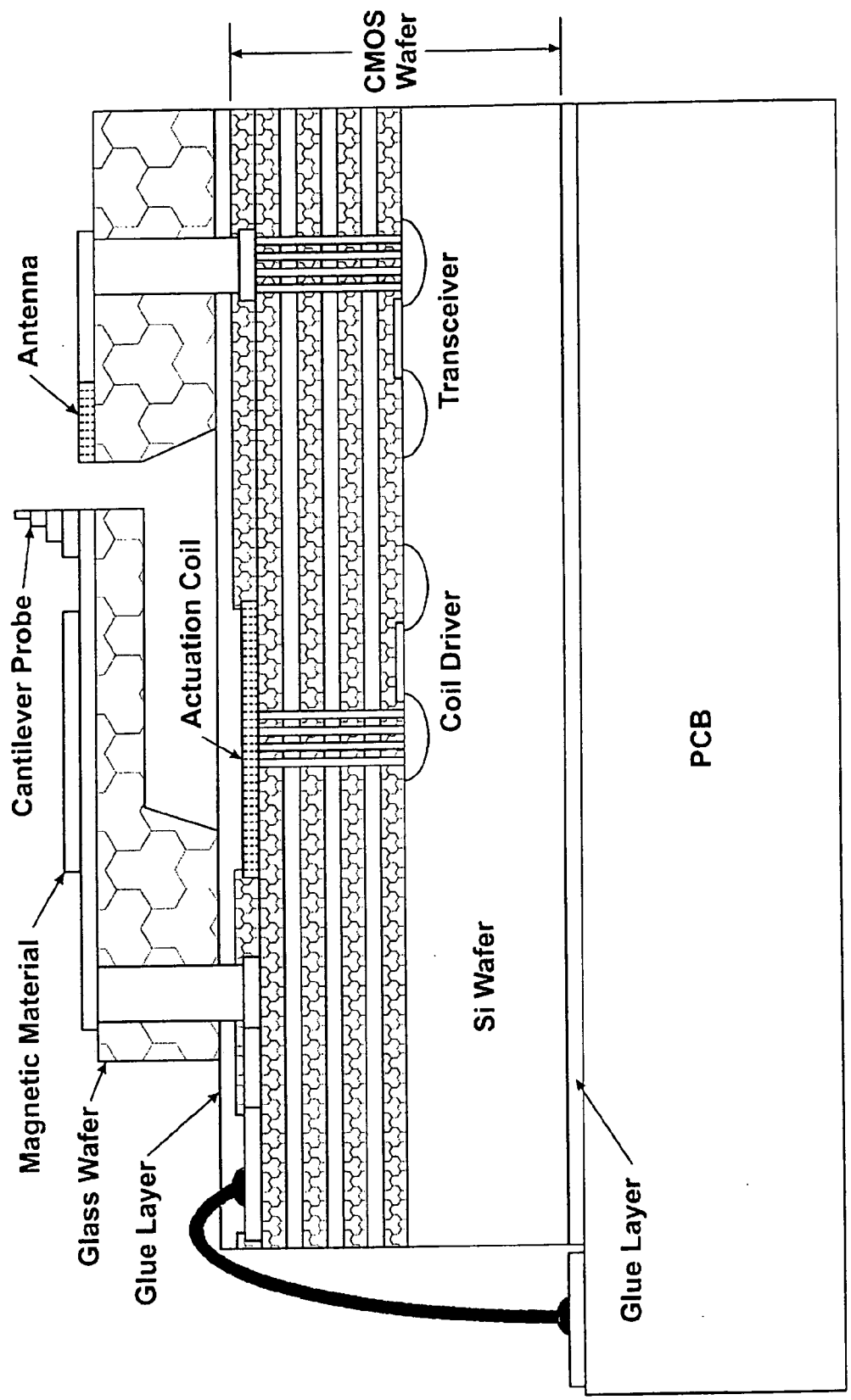
FIG. 6*b* is a side elevation view, in section, of an actuated cantilever probe for a hybrid probe card.
Figure 6C:
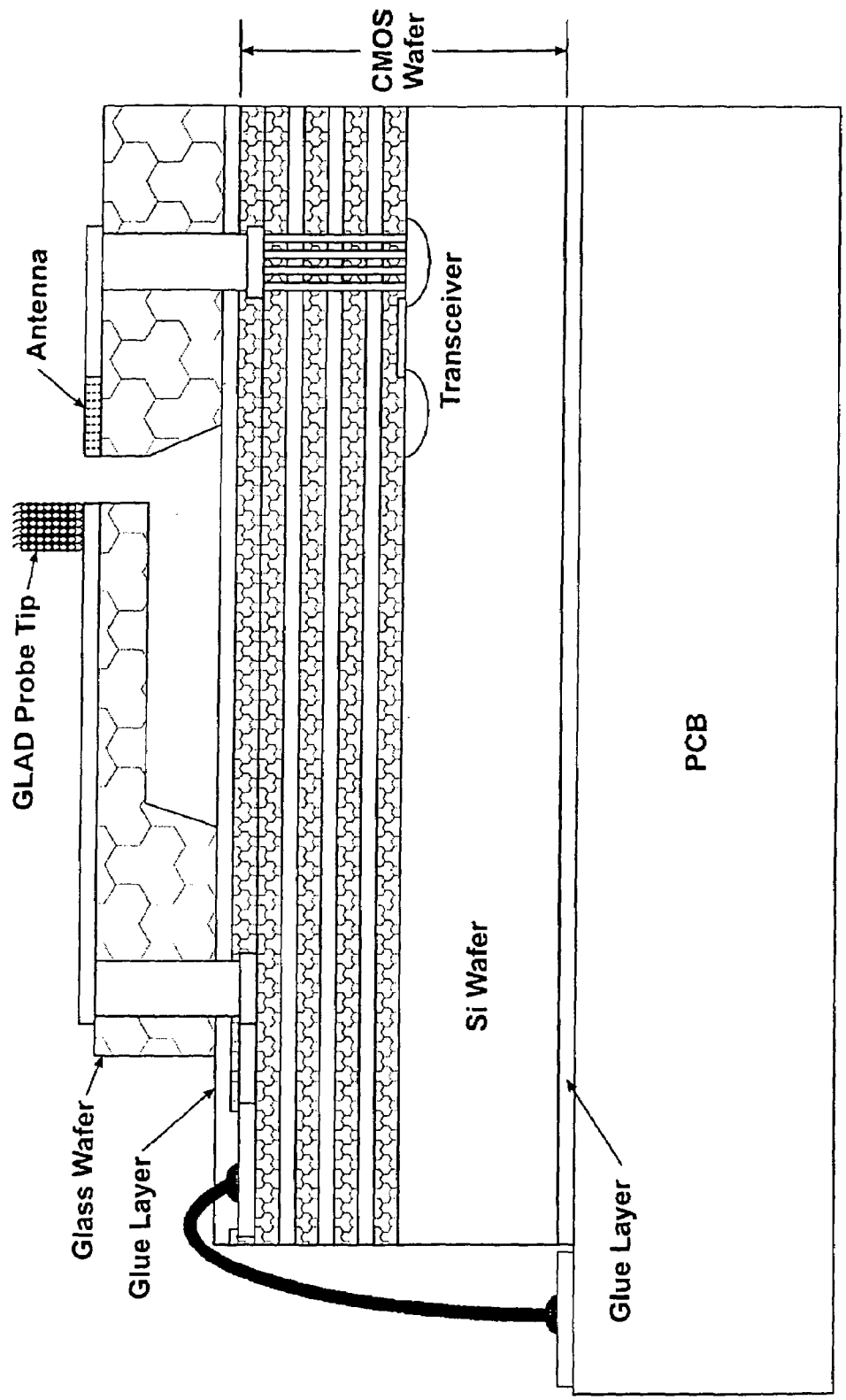
FIG. 6*c* is a side elevation view, in section, of a cantilever probe with glad tips for a hybrid probe card.

Referring to FIG. 5, an independent scanning head generally referenced by numeral 26 is also provided. Independent scanning head 26 has wireless i/o cells 28 that are compatible with wireless i/o cells 14 on electronic circuit 12 illustrated in FIG. 3, such that data may be exchanged to confirm proper functioning of electronic circuit 12. Referring to FIG. 5 in the illustrated embodiment, independent scanning head 26 is scanning a semiconductor wafer 30 with a plurality of electronic circuits 12 patterned on it as illustrated in FIG. 4. In the illustrated embodiment, scanning head 26 is supported and moveable along a supporting framework 32 so that scanning head 26 can move over the surface of semiconductor wafer 30, however it will be appreciated that there are other forms of supporting and moving scanning head 26.

Figure 3:
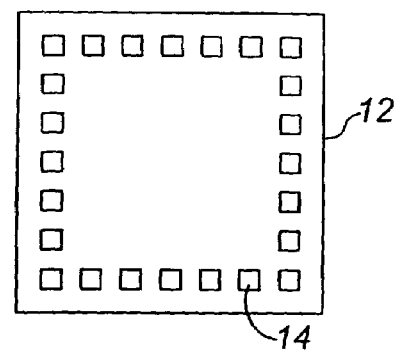
FIG. 3 is a top plan view of a electronic circuit having a plurality of i/o cells.

A different circuit is provided for each wireless i/o cell 14 illustrated in FIG. 3, to be tested by non-contact tester 10. Referring to FIGS. 4 and 5, wireless i/o cells 28 have a plurality of contact points which are adapted to correspond on a one to one relationship with a plurality of contact points provided on wireless i/o cell 14 of electronic circuit 12 that is being tested.

Referring to FIG. 1, wireless i/o cell 14 uses radio frequency interface 24 which includes a transmitter 18 and a receiver 34, however it will be appreciated that in the alternative, non-contact tester 10 could also use an optical or a magnetic interface for sending and receiving signals.

Where an optical interface is used, the optical interface will include at least one light emitter and at least one light receptor. Where a magnetic interface is used, the magnetic interface will include at least on magnetic generator and one magnetic detector.

The use and operation of non-contact tester will be now be described with reference to FIGS. 1 through 5. To test circuits in a non-contact manner, non-contact tester 10 is provided as described above. Referring to FIG. 5, wafer 30 with is positioned below independent scanning head. Scanning head 26 is supported by and moves along supporting framework 32 so that scanning head 26 can move over the surface of semiconductor wafer 30, to test electronic circuits 12 on wafer 30.

Independent scanning head 26 has wireless i/o cells 28 compatible with wireless i/o cells 14 on electronic circuit 12, such that data may be exchanged with electronic circuit 12. Finally, electronic circuit 12 is tested by exchanging data with independent scanning head 26 to confirm proper functioning of electric circuit 12. Referring to FIG. 2, a computer 36 with a Ghz vector processor 38 is provided for controlling independent scanning head 26 and for collection of data.

Additional Information:

Non-contact tester is comprised of a silicon substrate and a plurality of microfabricated antennae structures. Each antenna is located within the silicon substrate in a manner such that when the scanning antenna is aligned with the DUT (Device Under Test) on a wafer, each antenna is coincident in 2 dimensions to a reciprocal antenna structure located on the DUT.

Power is coupled to the wafer by way of microfabricated MEMS cantilever test probes. Alternatively, power may be coupled using RF (radio frequency) energy by way of microfabricated antennae structures patterned on the same substrate as the wireless i/o cell structures. Alternatively, power may be coupled magnetically using microfabricated inductors or transformers. Alternatively, power may be coupled optically by way of incident energy on a microfabricated structure on the DUT.

The non-contact tester comprises of a microfabricated scanning antenna, a printed circuit board and a plurality of electronic circuits.

Frequency discrimination between adjacent pads is by way of different oscillating frequencies. This is accomplished using ring oscillator chains of different length.

Antenna size and structure on the wafer is matched to the ring oscillator frequency.

The scanning circuits located in the scanning head "auto tune" to the carrier frequency of the test circuit transmitter located on the wafer. Encoded data is received and decoded from the carrier signal.

A simple rectifier circuit is used to decode the signal transmitted from the scanning head to the wafer.

Test vectors may be generated "on chip" using BIST (Built-In Self Test) techniques. Alternatively, test vectors may be generated using a memory element and logic sequencer.

Test vectors may be generated externally and coupled to the DUT using the scanning head. Test vectors may be applied to individual i/o pads in this way.]

The present invention comprises a test circuit for testing an electronic circuit on a wafer during wafer test (Functional test). The present invention comprises a test circuit for testing an electronic circuit on a wafer during wafer fabrication (Process Control Monitoring).

Antenna structures are approximately the same size as standard i/o cells.

Optionally, optical methods may be used to interface to the electronic circuit. These include use of high speed CMOS image sensors and high speed PIN diodes.

Optionally, magnetic methods may be used to interface to the electronic circuit. These include use of high speed Giant Magneto Resistive Thin Film heads and high speed magnetic coils.

This technology allows for testing electronic circuits during the IC fabrication process using wireless RF telemetry. The technology adds to or replaces existing bonding pads in an electronic circuit with an RF transceiver device. This device can act as a bonding pad during manufacture and test of an electronic circuit and communicates information in a wireless manner. Using this wireless i/o probe, semiconductor manufacturers can stop the trend of growing test costs with respect to transistor fabrication cost while at the same time improving test performance in areas that are causing very serious problems.

Additional Benefits:

The solution saves money in several ways at the same time;
1. Non-contact testers are significantly less expensive than current mechanical probe cards
2. Non-contact testers eliminate i/o bond pad damage during touch downs.
3. Mechanical contact testers such as probes cards "wear out" due to mechanical failure. Non-contact testers do not suffer from mechanical wear and therefore require less cleaning and maintenance.
4. Non-contact testers offer unique prototype test capabilities not available with conventional test methods such as internal test points.
5. Non-contact testers can test to smaller geometries and at higher speeds, thereby postponing expensive test equipment upgrades.
6. Non-contact tester technology provides improved test coverage by allowing the electronic circuit to be tested "at speed".

Improvements

Improvements relating to the development of the technology will now be described with reference to FIGS. 6 through 14.

All present state-of-the-art wafer probing techniques utilize probes which physically contact the device being tested and have limitations with respect to number of contacts, size of contacts, operating frequency, parallel testing capability, damage to the devices being tested. Non-contact testing of integrated circuits requires wireless communications between a probe card and the Device Under Test (DUT) over a very small distance. This is accomplished by implementing a small transceiver connected to a microfabricated antenna both on the probe card and the DUT. The radio frequency (RF) energy is coupled between the two antennae to permit information transfer.

Power must also be transferred to the DUT from the probe card by non-contact means. This is accomplished by transmitting RF power from the probe card through microfabricated antennae, receiving the power on the DUT through corresponding antennae, and converting the received RF energy to DC power. The amount of power that can be transferred from the probe to the DUT is limited by the size of the antenna and the number of antenna available for power transfer. The design of the antenna structures and transceiver circuits requires achieving a complex balance among many parameters. The design considerations which need to be addressed include the following:

On-chip real estate requirements for antennae and transceiver circuits

Signal coupling efficiency between probe and DUT antennae

Power coupling efficiency between probe and DUT antennae

Interference between adjacent antenna pairs on both the probe and DUT

Maintaining signal integrity

Maintaining full CMOS process compatibility

Ensuring that components added to DUT have no impact on normal device operation

Ensuring that components added to DUT do not effect manufacturing yield

Many microfabricated antenna designs have been and continue to be researched. However, these designs are generally intended for other types of applications and do not have the stringent requirements needed for semiconductor testing described above. In addition, many transceiver circuits have been developed for other applications. And whereas these circuits may be used for transmitting and receiving data at high bit rates, they are not appropriate wafer probe since they require a large amount of silicon real estate on the DUT.

Non-Contact Probes Used with Contact Probes ("Hybrid")

It is recommended that for high power devices, a hybrid approach be used in which power is connected using contact probes while data is transferred wirelessly.

Only a Few Different Types of Signals (Vdd, Vcore, Vio, Vss, Gnd)

Most devices have multiple power and ground pins (P4 has 72 Vcc pins and more than 150 ground pins in 478 pin package; 256 MB Flash has 2 Vcc pins and 2 ground pins in 80 pin package)

When using standard contact probe cards, if one data pin does not contact properly, the probe card must be lifted off and touched down again When using a hybrid probe card, the inherent redundancy of the power and ground pins means that if one pin did not make proper contact, there is no need to lift off and touch down again. The remaining power and ground should be able to deliver power sufficiently.

Manufacturers of contact based probe cards are currently using this redundancy in power and ground pins to reduce the number of contact points per DUT.

There are three types of contact probes which can be used:

Standard cantilevers (see FIG. 6a)
  Contact forces similar to those of conventional probe tips
  Can be microfabricated using automated wafer processing techniques Actuated cantilevers (see FIG. 1b)
  Reduced contact forces since cantilevers can be actuated at kHz frequencies to cause scrubbing
  The force on each bond pad can be precisely controlled and does not depend on the planarity of the wafer
  Reduced force and smaller scrub marks result in less cleaning requirements for probe tips
  Potential to make "generic" probe cards where probe tips are manufactured on a standard grid pattern. As long as the bond pads on the DUT are placed on this grid, only the required cantilever probes will be actuated to make contact with the DUT. Thus, one probe card may be used to test different DUTs as long as the bond pads on each DUT are correspond to a location on the standard grid pattern.

Cantilever with GLAD tips (see FIG. 1c)
  Reduced contact forces due to scrubbing action of many fine tips rather that one large tip
  Forces on pads across the wafer are more uniform due to two spring constants on probes (one for the cantilever and one for the GLAD tip)
  We cannot use existing standard probe technology since we need to be within 100 µm of the wafer to perform wireless communications. Most probe needles and microsprings require the probe card to be further away.
  Our technology seamlessly migrates to full wafer probing. Using standard probes for our hybrid version does not meet this objective.
  Current advanced technology contact probe cards have the inherent limitation that they are manufactured on custom substrates (usually ceramic). As such, scaling this probe cards to support full wafer probing is not possible due to thermal expansion and manufacturing issues. Contact probes in accordance with the present invention are fabricated directly on silicon or glass substrates, which are the same as those used for IC fabrication. As such, scaling to full wafer capability is possible.
  As pin counts increase, current advanced technology contact probe cards become inherently unreliable since they need to contact all pins (power and I/O) reliably. With this hybrid solution, only the power pins needs to make contact. Thus, the reliability increases significantly due to the reduced number of contacts and inherent redundancy of power pins.
  Current advanced technology contact probes have lengths in the tens of millimeters. This means that de-coupling capacitors have to be placed tens of millimeters away from the power pads. With probes in accordance with the present invention, small capacitances can be placed on the silicon substrate within a few hundred microns of the power pads.

Maintaining Signal Integrity on Silicon Wafer

The proposed solution requires data signal to be brought to the edge of the Si wafer for connection to the probe card PCB.

Patterning metal on a silicon substrate degrades signal integrity when signals travel a large distance. This distance ranges from less than a millimeter to a few centimeters, depending on trace widths and driver capabilities. This is the case where signals from the centre of a 200 mm or 300 mm wafer are required to be brought to the edge of the wafer.

To bring out a signal from the center of the wafer to the edge of the wafer at the required frequencies would require tens to hundreds of buffer drivers, each adding a delay to the signal. This is not an acceptable solution.

It is important that the signals from one die site (chip) be brought to the edge of the wafer with the necessary relative synchronization (edge placement) and signal integrity.

Two solutions can be used. The first solution is to use multiple pipelines, two for each data signal (one input pipeline and one output pipeline), in order to get signals in and out of each die site. The pipelines for each group of signals for given die site would have the same number of elements (n), except for the chip's clock signal, which would have $2n$ elements.

The final elements of each input pipeline (the elements connected directly to the transceiver circuit of the IO cell and designated as $I_n$) would be clocked by a local clock tree. The clock tree would be driven by the last element of the clock pipeline (falling edge of the chip's clock signal), designated as $CLK_{2n}$. The final elements of each output pipeline (designated as $O_n$) would be clocked by a local clock tree driven by the second last element of the clock pipeline (falling edge of the chip's clock signal), designated as $CLK_{2n-1}$. Each previous element in the input and output pipelines would be clocked by alternating elements of the clock pipeline [i.e. $I_{n-i}$ would be clocked by $CLK_{2(n-i)}$, $O_{n-i}$ would be clocked by $CLK_{2(n-i)-1}$]. The clock skew from last element of the pipeline to the first element of the pipeline will be less than 25% of the clock period.

There could be a programmable delay element added between the last element of the clock pipeline and the clock input transceiver cell. This will ensure that the data inputs are valid before the clock signal is asserted. Also, the edge placement of the clock may be adjusted with respect to the edges of the input data signals.

This connectivity scheme is illustrated in the schematic below in FIG. 7a.

The second solution is to use delay locked loops (DLLs) to distribute the clock signal throughout the wafer. This clock signal can then be used to clock the input and output pipelines. This solution requires a setup time for all the DLLs to lock, before the test vectors can be input through the pipeline. Since the clock signal is locked to the original, a programmable delay element after the last element is not required. This scheme is illustrated in FIG. 7b.

Yield Enhancement through Redundant Circuits

In order to increase probe card yield, a redundancy of transceiver circuits and latches is used.

There are several methods which can be used to select and connect working circuit blocks.

Selector switches:
  The blocks of redundant circuits are routed through a simple selector switch. Each block provides a pass/fail signal to the selector switch after running a self-check. The selector switch then connects a working block into the main circuit.

Programmable multiplexer
  The blocks of redundant circuits are tested independently to determine which ones are working correctly. The blocks could also provide a pass/fail signal which is examined. A programmable multiplexer is then set to connect the working block into the main circuit.

Fusable links
  The blocks of redundant circuits are connected into the main circuit with fusable links. The blocks are tested independently to determine which ones are working correctly. The blocks could also provide a pass/fail signal which is examined. One working block is kept connected into the main circuit while the fusable links to all other blocks are blown with a laser.

Figure 8:
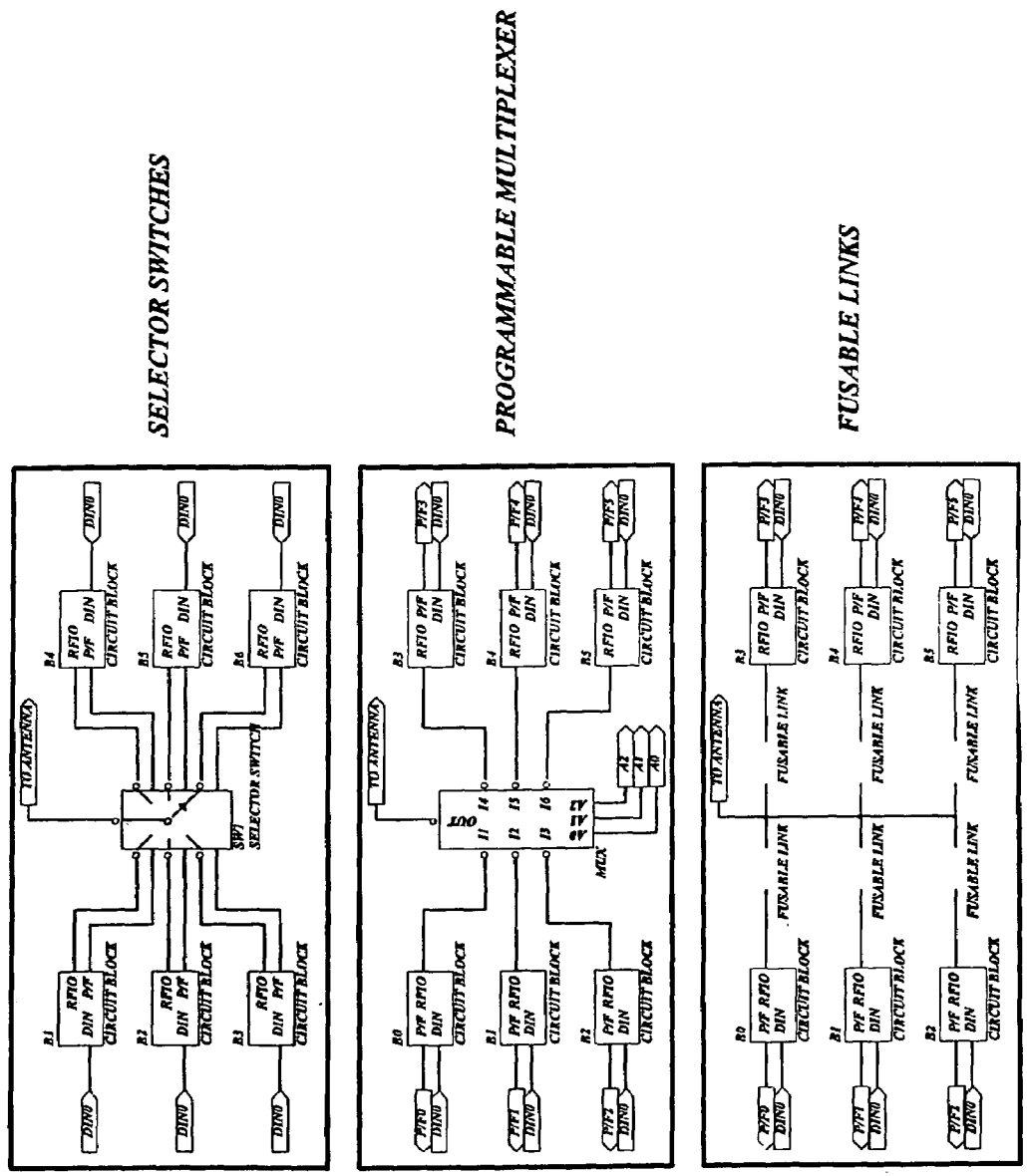
FIG. 8 is a schematic diagram demonstrating yield enhancement through redundant circuits.

A schematic illustrating the above three methods is shown in FIG. 8.

The number of redundant blocks for a given circuit will depend on the pad density and pad pitch of the DUT. For devices with high pad densities and small pad pitches, there is redundancy factor of 2 to 3, while for devices with low pad densities and large pad pitches, the redundancy factor can be much greater (factors greater that 6 are feasible, although factors of 4 to 6 would be most common).

The feature sizes and design rules for circuits and interconnections without redundancy are set to minimize the probability of defects. This is possible since wafer real estate is not an issue.

Wireless Transceiver Circuit

The wireless probe card technology presented uses antenna structures and transceiver circuits on the DUT. The transceiver electronics required on the DUT will have minimal or no impact on chip real estate for most applications. Matching antenna structures and transceiver circuitry on the probe card enable bi-directional communication with the DUT. For transmitting power wirelessly, the power bond pads on the DUT are replaced by antenna structures and power rectification circuitry. Upon completion of the testing phase, the antenna structures can then be wire bonded directly.

A functional prototype utilizing microfabricated 300 μm antenna structures and off-the-shelf transceiver chips has been developed and demonstrates simultaneous bi-directional communications using multiple antenna structures. Wireless power coupling to the DUT has also been verified with this prototype. The results are from a monolithic, fully integrated CMOS prototype, which combines 60 μm antenna structures and optimized high speed CMOS transceiver circuits.

Figure 9:
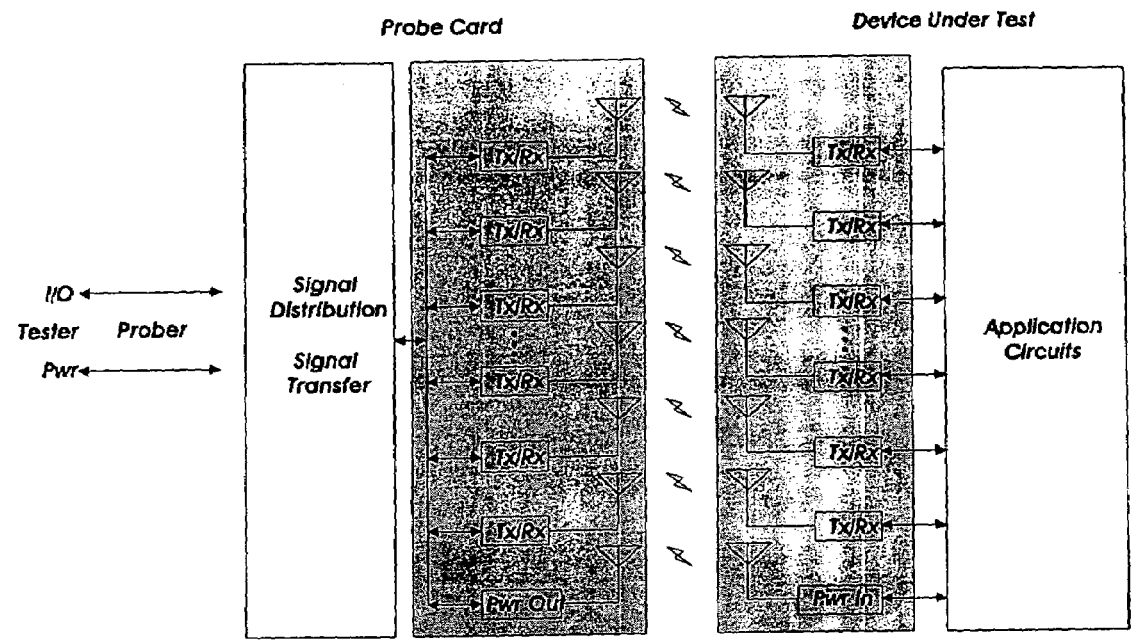
FIG. 9 is a block diagram of non-contact wafer probe system.

During testing, the DUT is brought in close proximity (less than 100 μm) to the matching antenna array on a wireless probe card connected to a conventional wafer probe test system. The architecture of the overall wafer probe system is shown in FIG. 9. Data signals (I/O) and power from the tester are transferred through the probe card to each individual probe (wireless transceiver for data signals and power transmitter for power signal). The data signals from the tester are modulated/demodulated onto a high frequency carrier (5 GHz) by the transceiver circuits and transmitted/received wirelessly to and from the DUT. The RF power signal is transmitted to the corresponding power receiver on the DUT, where it is rectified to provide DC power to the entire chip.

Figure 10:
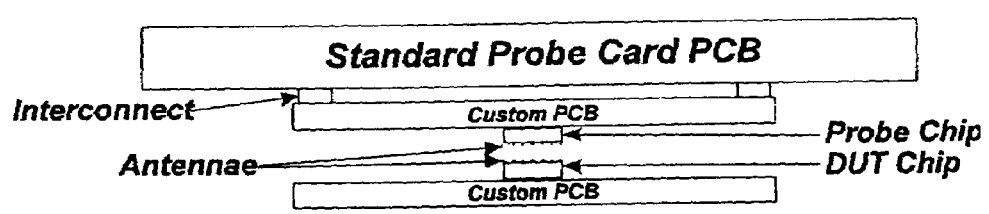
FIG. 10 is a side elevation view, in section, of non-contact wafer probe system.
Figure 11:
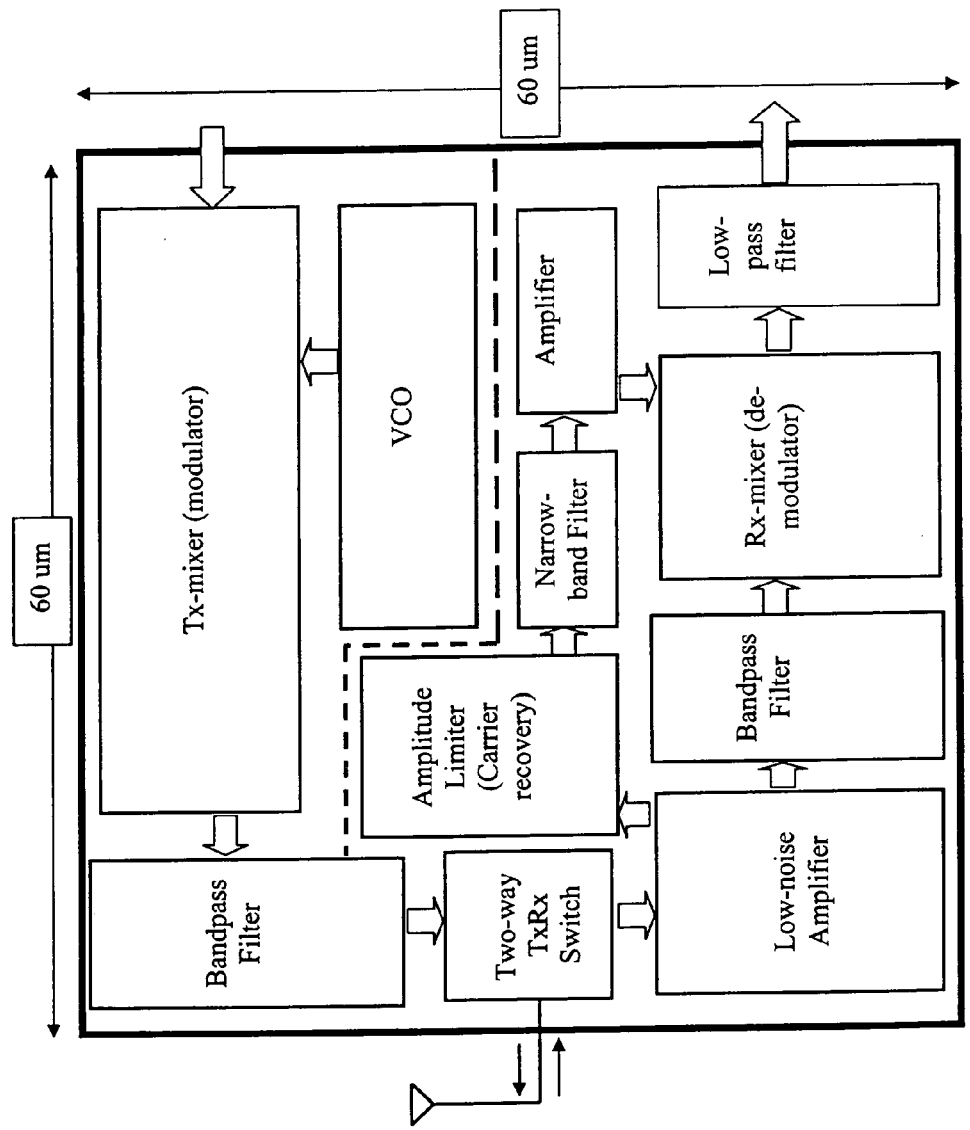
FIG. 11 is a block diagram of i/o cell layout.
Figure 12:
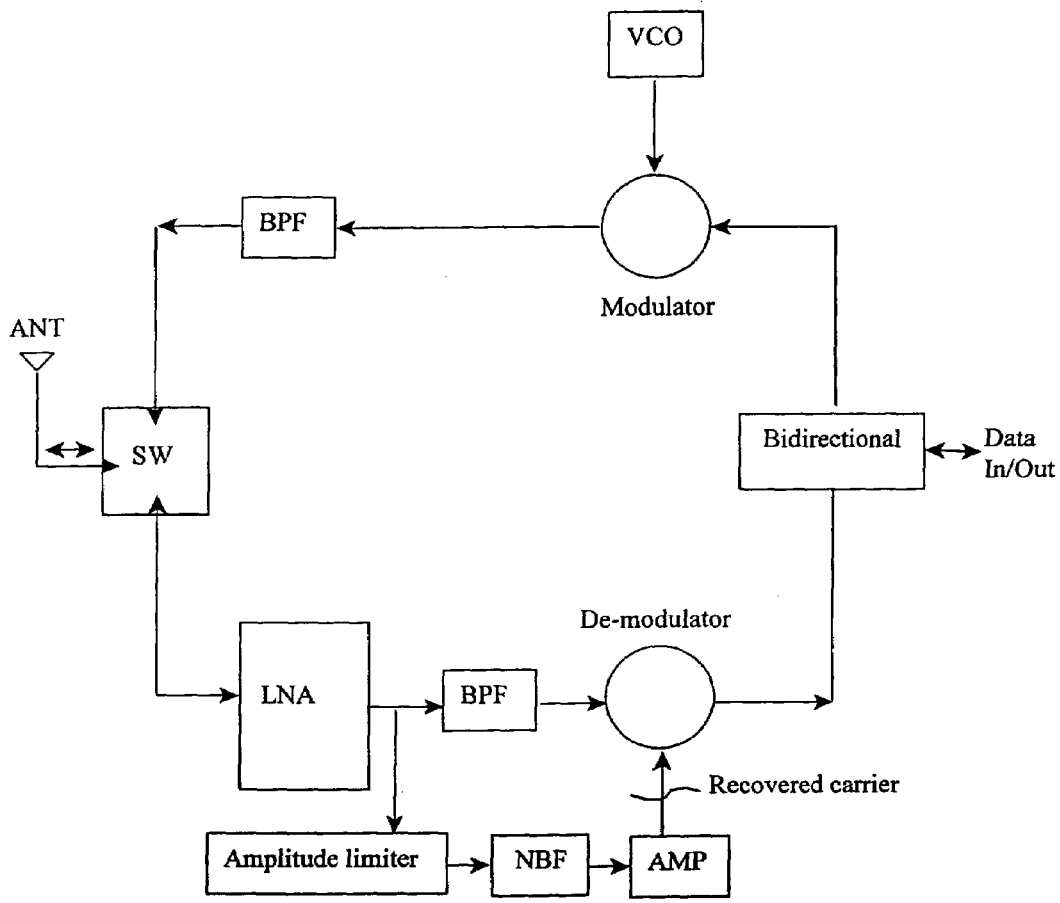
FIG. 12 is a block diagram of an i/o cell transceiver.
Figure 13:
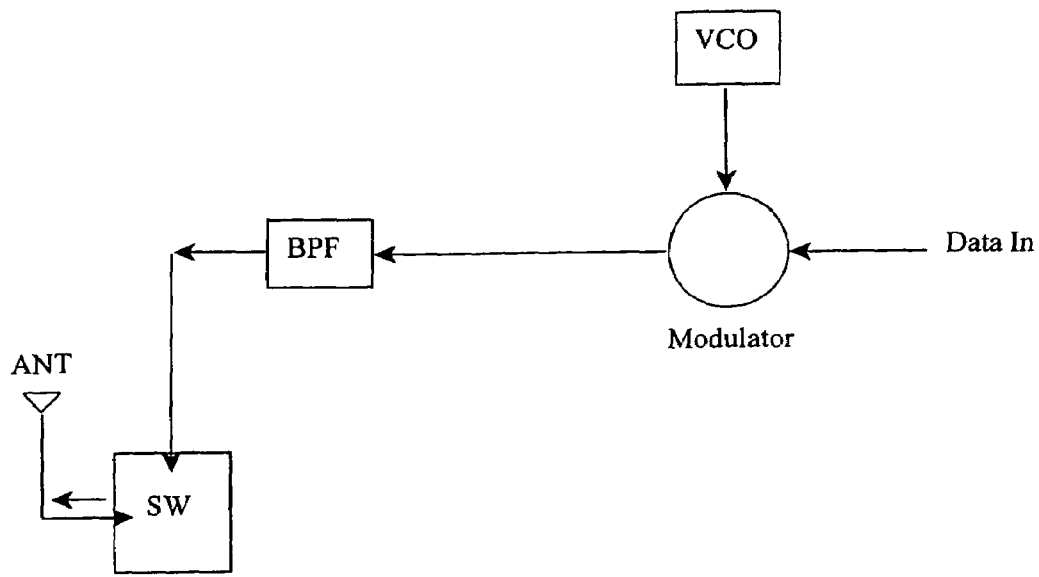
FIG. 13 is a block diagram of an i/o cell transmitter.
Figure 14:
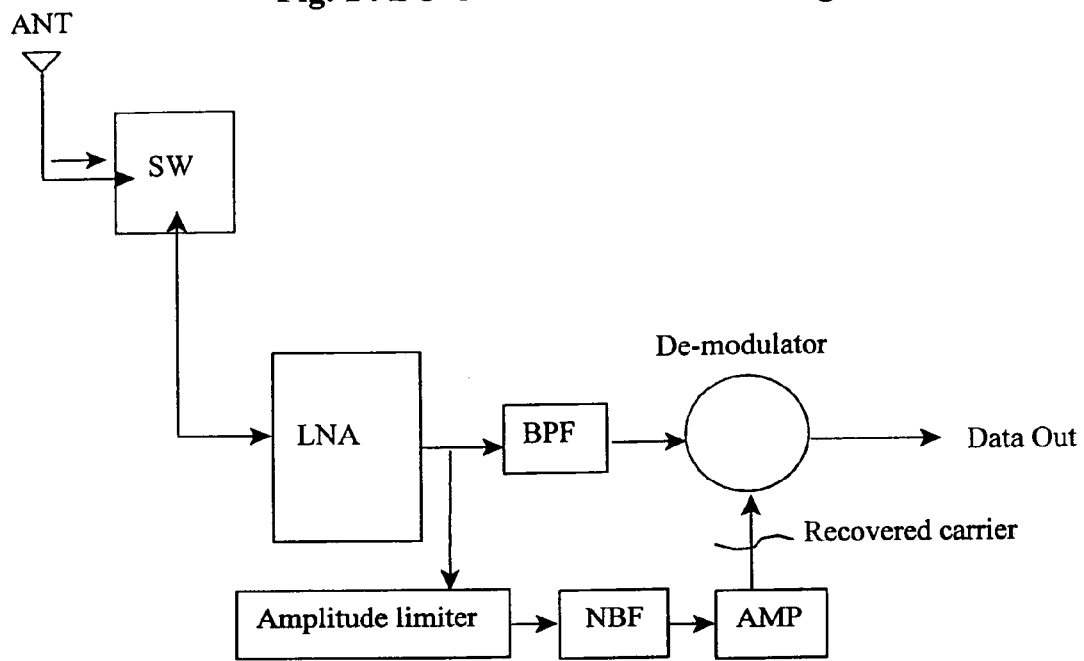
FIG. 14 is a block diagram of an i/o cell receiver.

The focus of this work is the design and performance of the microfabricated antennae and transceiver circuits used in the system (shown as the shaded areas in FIG. 9). These components are fabricated on two separate CMOS chips using 0.18 μm technology. The cross-sectional diagram of the system detailing the positioning of the chips is shown in FIG. 10. One chip is designed to be the probe while the other acts as the DUT. Optimized antenna design and very low transmission power levels minimize signal cross talk.

Figure 15:
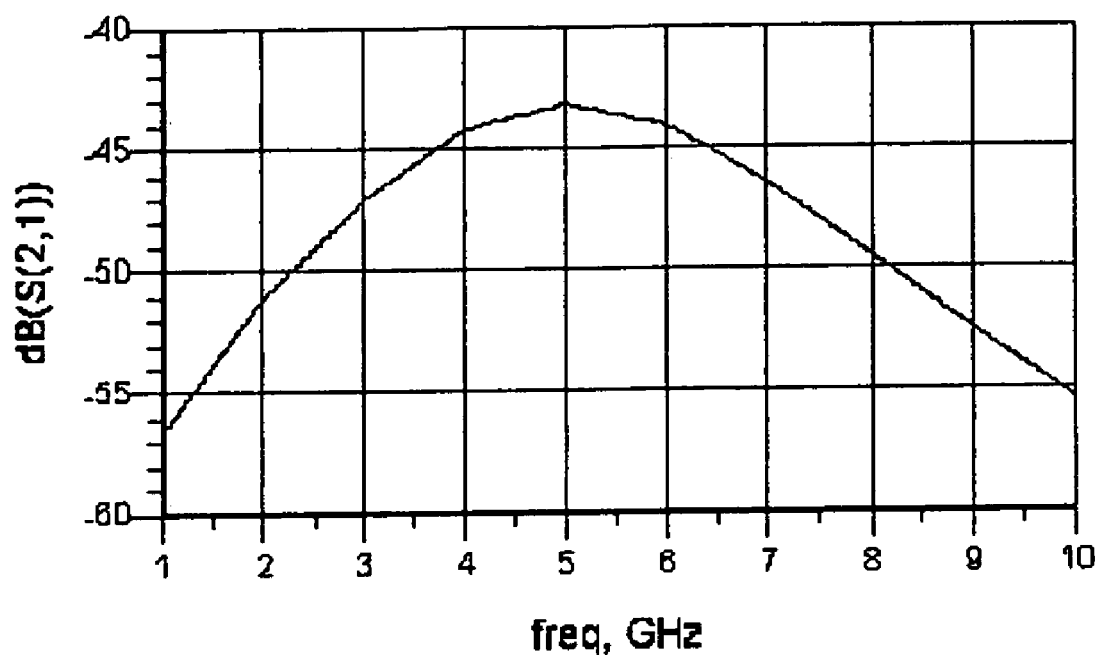
FIG. 15 is a graph of transmission loss for a pair of data transfer antennae.

The performance of the antenna structures and transceiver circuits have been modeled and simulated. For the antennae, the simulations were performed using a combination of three different simulation software packages. The first two packages, Totem (developed in an academic environment) and AxFDTD use the Finite Difference Time Domain (FDTD) method. The third package, Advanced Design System (ADS), used Method of Moments (MoM) analysis. Different simulations were run on each of the different packages to determine the optimum antenna geometry, antenna pitch, antenna size, matching circuits, and antenna termination. The results of the simulation were used to select the types of antenna which were most suitable for data and power transfer. The transmission loss, parameter $S(2,1)$, for a pair of data transfer antennae is shown FIG. 15. As evident, the antenna pair is optimized for operation with a 5 GHz carrier.

Figure 16:
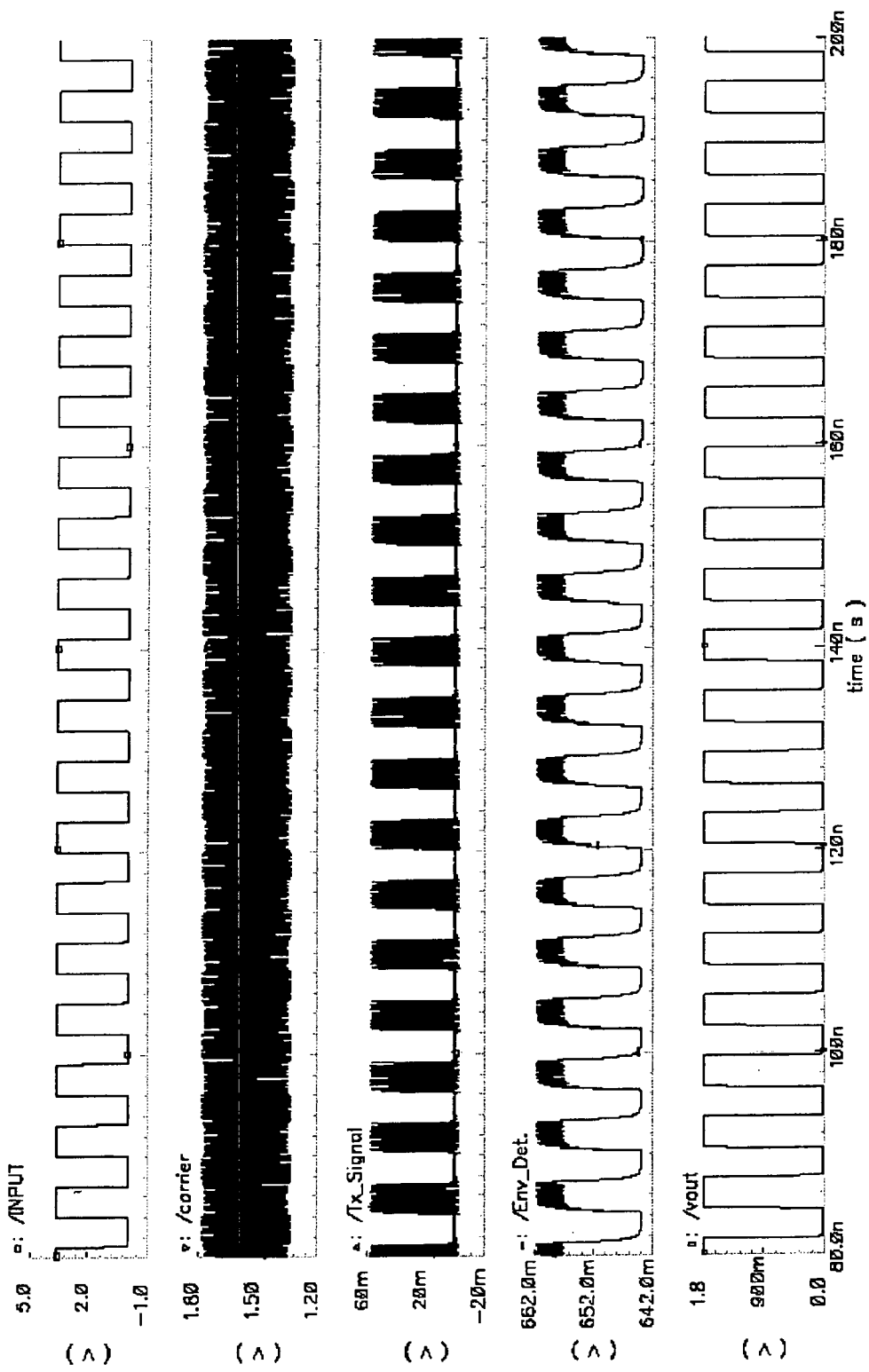
FIG. 16 is a graph of simulation results of transceiver circuit using two antennae.

The transceiver circuits used for data transfer were designed and simulated using Cadence software tools. The transceivers used an amplitude modulated (AM) carrier to transfer data. Data transfer rates of 1 Gbps were achieved. The simulation performance of the transceiver circuit is depicted in FIG. 16. The figure shows the input signal from the tester, the carrier signal, the AM modulated output of the probe transmitter, the output of the envelope detector circuit on the DUT, and the final output of the receiver on the DUT.

A communication circuit has been designed to operate in the radio frequency (RF) spectrum to facilitate communication between semiconductor integrated circuits. This element employs a unique circuit structure, low power operation and high data bandwidth.

Dual band transceiver in bi-directional signal transmission and reception system.

Single channel, single carrier signal transmission. This enables us to eliminate the circuitry necessary for multi channel transceivers. A further benefit is a reduction of power requirements.

Circuit is optimized for digital communication and therefore we realize a reduction in complexity and size.

Amplitude modulation at very high frequency. Standard practice limits AM modulation to several hundred megahertz. The system operates at several gigahertz. To achieve proper demodulation standard demodulation circuitry cannot be used at these high frequencies.

The system uses two transmission methods. The first transmits a carrier and a single side band. The receiving circuitry extracts and reconstructs the carrier and uses this signal to demodulate the data. This eliminates the need for PLL and VCO circuitry at the receiving end. The circuit layouts and block diagrams of this transceiver are show in FIGS. 11–14. The second method transmits an AM carrier. The receiving circuitry uses a high frequency envelope detection circuit to demodulate the data. This method also eliminates the need for PLL and VCO circuitry at the receiving end.

In order to have minimal impact of chip real-estate when using wireless I/O cells in an IC design, the transceiver circuit needs to fit underneath the bond pad/antenna.

A fully bi-directional transceiver circuit has been developed that occupies an area of 40,000 square microns (200 µm ×200 µm) and 3600 square microns (60 µm ×60 µm).

Similar circuits have been designed which occupy areas in the order of 4 square millimeter (over 1000 times larger). These circuits do transmit more power and operate over greater distances.

Transceivers are optimized for low power, short distance (<100 µm) communications suitable for chip-to-chip communication.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

It will be apparent to one skilled in the art that modifications may be made to the illustrated embodiment without departing from the spirit and scope of the invention as hereinafter defined in the Claims.

What is claimed is:

1. A tester for electronic circuits, comprising in combination:
    an electronic circuit which includes a plurality of wireless i/o cells and means for sending and receiving signals via each of the wireless i/o cells, a wireless i/o cell being provided for each contact point on the electronic circuit to be tested;
    an independent scanning head having a plurality of wireless i/o cells compatible with the wireless i/o cells on the electronic circuit, such that data may be exchanged with the electronic circuit to confirm proper functioning of the electronic circuit, the number of wireless i/o cells on the independent scanning head corresponding in a one to one relationship with the number of wireless i/o cells on the electronic circuit being tested;
    the scanning head having a contact probe for power input to energize the electronic circuit.

2. The tester for electronic circuits as defined in claim 1, wherein each of the wireless i/o cells of the electronic circuit to be tested has an input pipeline and an output pipeline for each data signal.

3. The tester for electronic circuits as defined in claim 2, wherein a final element of each input pipeline is clocked a clock tree driven by a last element of clock tree and a final element of each output pipeline is clocked by the clock tree driven by a second last element of the clock tree.

4. The tester for electronic circuits as defined in claim 2, wherein delay locked loops are used to distribute a clock signal to both the input pipeline and the output pipeline.

5. The tester for electronic circuits as defined in claim 1, wherein yield enhancement is achieved through redundant transceiver circuits.

6. The tester for electronic circuits as defined in claim 1, wherein dual band transceivers are used with single channel, single carrier signal transmissions.

* * * * *